(12) United States Patent
Towle

(10) Patent No.: US 7,039,263 B2
(45) Date of Patent: May 2, 2006

(54) ELECTROOPTIC ASSEMBLY

(75) Inventor: Steven Towle, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 155 days.

(21) Appl. No.: 10/253,834

(22) Filed: Sep. 24, 2002

(65) Prior Publication Data

US 2004/0057649 A1    Mar. 25, 2004

(51) Int. Cl.
*G02B 6/00*    (2006.01)

(52) U.S. Cl. .......................... 385/14; 385/32; 385/33; 385/88; 385/89; 385/93; 257/183; 257/200; 257/676; 257/678; 257/680

(58) Field of Classification Search ............... 385/14, 385/88, 89, 93, 32, 33; 257/678, 183, 200, 257/680, 676
See application file for complete search history.

(56) References Cited

U.S. PATENT DOCUMENTS

| | | | |
|---|---|---|---|
| 5,168,537 A | 12/1992 | Rajasekharan et al. | |
| 5,627,931 A | 5/1997 | Ackley et al. | |
| 5,631,988 A | 5/1997 | Swirhun et al. | |
| 5,905,633 A * | 5/1999 | Shim et al. | 361/704 |
| 5,999,670 A * | 12/1999 | Yoshimura et al. | 385/31 |
| 6,009,632 A * | 1/2000 | Douglas | 33/562 |
| 6,034,578 A * | 3/2000 | Fujita et al. | 333/193 |
| 6,039,831 A * | 3/2000 | Mine et al. | 156/272.6 |
| 6,271,469 B1 | 8/2001 | Ma et al. | |
| 6,404,960 B1 * | 6/2002 | Hibbs-Brenner et al. | 385/52 |
| 6,498,358 B1 * | 12/2002 | Lach et al. | 257/183 |
| 6,569,248 B1 * | 5/2003 | Hertz | 118/504 |
| 6,569,712 B1 * | 5/2003 | Ho et al. | 438/121 |
| 6,809,413 B1 * | 10/2004 | Peterson et al. | 257/680 |
| 2001/0013642 A1 * | 8/2001 | Jiang et al. | 257/676 |
| 2002/0028045 A1 * | 3/2002 | Yoshimura et al. | 385/50 |
| 2002/0097962 A1 * | 7/2002 | Yoshimura et al. | 385/50 |
| 2002/0102060 A1 | 8/2002 | Jewell et al. | |
| 2002/0114587 A1 * | 8/2002 | Golwalkar et al. | 385/88 |
| 2002/0114588 A1 * | 8/2002 | Golwalkar et al. | 385/88 |
| 2002/0149636 A1 * | 10/2002 | Takabayashi et al. | 347/9 |
| 2003/0002770 A1 * | 1/2003 | Chakravorty et al. | 385/14 |
| 2003/0016907 A1 * | 1/2003 | LoCascio et al. | 385/27 |
| 2003/0020094 A1 * | 1/2003 | Shrauger | 257/200 |
| 2003/0044157 A1 * | 3/2003 | Wickman et al. | 385/140 |
| 2003/0045403 A1 * | 3/2003 | Watterson et al. | 482/51 |
| 2003/0113974 A1 * | 6/2003 | Ning et al. | 438/379 |

(Continued)

FOREIGN PATENT DOCUMENTS

WO    WO 01/04671    1/2001

OTHER PUBLICATIONS

International Search Report from PCT/US03/28811, Apr. 2004.

(Continued)

*Primary Examiner*—Karl D. Frech
*Assistant Examiner*—Allyson N Trail
(74) *Attorney, Agent, or Firm*—Marshall, Gerstein & Borun LLP

(57) ABSTRACT

An electrooptic assembly including a microelectronic package and an optical substrate, wherein the optical substrate includes a coupler and a waveguide. An electrooptic element is disposed to convert an electrical signal from the microelectronic package to an optical signal for transmission to the coupler and waveguide, and/or to receive an optical signal and convert it to an electrical signal for transmission to the microelectronic package.

22 Claims, 4 Drawing Sheets

U.S. PATENT DOCUMENTS

| | | | |
|---|---|---|---|
| 2003/0166312 A1* | 9/2003 | Lee | 438/107 |
| 2003/0185484 A1* | 10/2003 | Chakravorty et al. | 385/14 |
| 2003/0210531 A1* | 11/2003 | Alcoe et al. | 361/728 |
| 2003/0210865 A1* | 11/2003 | Johannessen | 385/49 |
| 2003/0235378 A1* | 12/2003 | Yamaguchi | 385/92 |
| 2004/0005732 A1* | 1/2004 | Hiatt et al. | 438/105 |
| 2004/0028875 A1* | 2/2004 | Van Rijn et al. | 428/98 |
| 2004/0051169 A1* | 3/2004 | Chen et al. | 257/684 |
| 2004/0052468 A1* | 3/2004 | Pham et al. | 385/52 |
| 2004/0071387 A1* | 4/2004 | Mule et al. | 385/14 |
| 2004/0094830 A1* | 5/2004 | Vu et al. | 257/678 |
| 2004/0264840 A1* | 12/2004 | Mule et al. | 385/14 |

OTHER PUBLICATIONS

Sadler, et al. "Optical reflectivity of micromachined {111}-oriented silicon mirrors for optical input-output couplers," *J. Micromech. Microeng.* 7:263-269 (1997), no month.

Towle, et al., "Bumpless Build-Up Layer Packaging" pp. 25-31 (2001), no month.

* cited by examiner

ELECTROOPTIC ASSEMBLY

FIELD OF THE INVENTION

The present invention relates to apparatus and methods for packaging a microelectronic component with one or more optical components in a compact yet functional manner. In particular, the present invention relates to a packaging technology that aligns and secures an electrooptic element between a microelectronic package and a substrate with a waveguide.

STATE OF THE ART

Higher bandwidth, improved performance, lower cost, and increased miniaturization are ongoing goals of the computer industry to enhance communication between chips within a computer. It is known that integrated circuit components have undergone increased miniaturization and, as this goal is achieved, microelectronic dies become still smaller. Similar miniaturization of the microelectronic package is desirable as it would enable reductions in cost and component external dimensions (form factor).

As for achieving higher bandwidth, e.g., on the order of 10 Gb/s or more, optical interchip communications face many challenges. Among these challenges are high bandwidth, low latency communication between the microprocessor and the optical emitter/detector chips, alignment and coupling between the optical emitter/detector chips and a waveguide, and maintaining acceptable cost. Until now, the difficulty of meeting all of these challenges has meant that interchip communications are typically achieved in an electronic manner.

Meeting the challenges facing optical interchip communications will provide significant benefits, including the higher bandwidth that optical interchip communication provides as well as reduced noise from sources such as electromagnetic interference (EMI) and crosstalk. However, it will be necessary for electrooptic assemblies to provide good alignment to waveguide structures that may be located on the printed circuit board, low electrical parasitics between the microprocessor and optical emitter/detector chips, and relatively low cost fabrication.

Therefore, it would be advantageous to develop new apparatus and methods for securing a microelectronic package to a substrate such as a printed circuit board with an electrooptic element in alignment with a coupler and waveguide integrated into the printed circuit board (electrooptic PCB) to provide a suitable electrooptic assembly.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Although FIGS. 1–12 illustrate various views of the present invention, these figures are not meant to portray microelectronic and optical assemblies in precise detail. Rather, these figures illustrate microelectronic and optical assemblies in a manner to more clearly convey the concepts of the present invention. Additionally, it should be noted that elements common between the various figures retain the same numeric designation throughout the various views.

The present invention includes a packaging technology that secures a microelectronic package to an electrooptic PCB in a manner that secures an electrooptic element in alignment with a coupler and waveguide in the electrooptic PCB. The electrooptic element is disposed between the microelectronic package and the electrooptic PCB to convert an electrical signal from a microelectronic die in the microelectronic package to an optical signal that is transmitted to the coupler and waveguide. Alternatively, the electrooptic element can convert an optical signal from the coupler and waveguide in the electrooptic PCB to an electrical signal that is transmitted to the microelectronic package.

Figure 1:
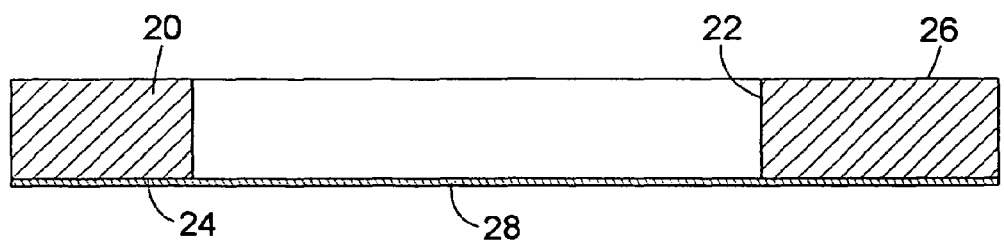
FIG. 1 is a side cross-sectional view of a microelectronic package core abutted to a protective film, according to the present invention.

FIG. 1 illustrates a microelectronic package core 20 which comprises a substantially planar material used to fabricate a microelectronic package having an opening 22 formed therein. The opening 22 extends completely through the microelectronic package core 20 from a first, active surface 24 to an opposing, second surface 26. As will be appreciated, the opening 22 may be any shape and size with the only limitation being that it be appropriately sized and shaped to house a corresponding microelectronic die therein, as will be discussed below.

Figure 2:
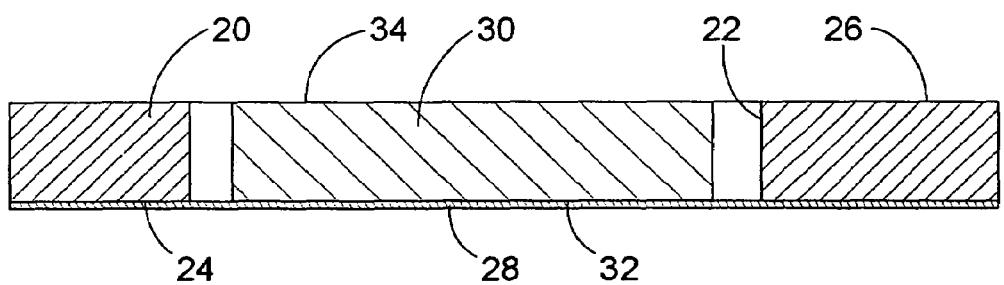
FIG. 2 is a side cross-sectional view of a microelectronic die disposed within an opening of the microelectronic package core of FIG. 1.
Figure 3:
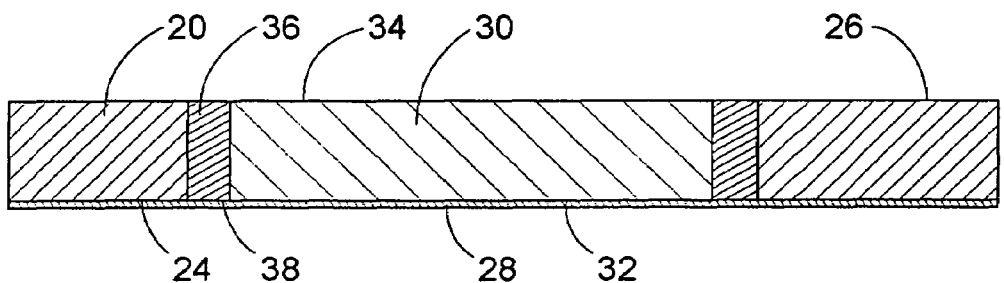
FIG. 3 is a side cross-sectional view of the assembly of FIG. 2 after the microelectronic die has been encapsulated.
Figure 4:
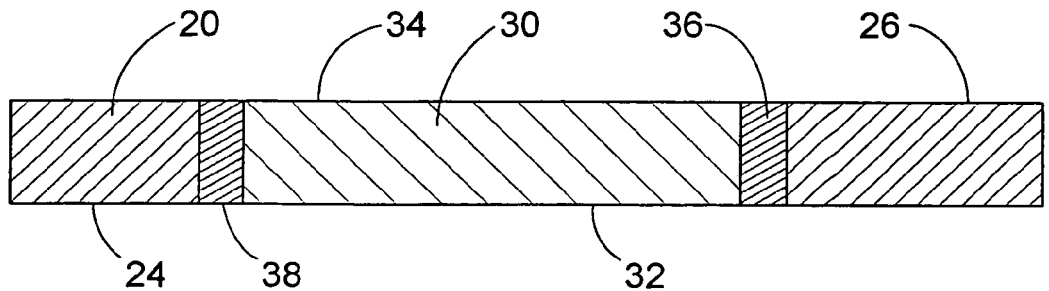
FIG. 4 is a side cross-sectional view of the assembly of FIG. 3 after the protective film has been removed.

FIG. 1 illustrates the microelectronic package core second surface 26 abutting a protective film 28. A microelectronic die 30 having an active surface 32 and a back surface 34 is placed in the opening 22 of the microelectronic package core 20, as shown in FIG. 2. The microelectronic die 30 is placed such that its active surface 32 abuts the protective film 28 which may have an adhesive, such as silicone, thereon. The protective film 28 attaches to the first, or active, surface 24 of the microelectronic package core 20 and the active surface 32 of the microelectronic die 30, as shown in FIG. 4. Alternatively, the protective film 28 may be a non-adhesive film depending upon the encapsulation process.

In particular, an adhesive-type protective film 28 may be applied prior to placing the microelectronic die 30 and microelectronic package core 20 in a mold or other piece of equipment which can be used for an encapsulation process. The protective film 28 may also be a non-adhesive film, such as a EPFE (ethylene-petrafluoroethylene) or Teflon® film, which is held on the microelectronic die active surface 32 and the microelectronic package core first, or active surface 24 by an inner surface of a mold or other piece of equipment which can be used for an encapsulation process. In either case, the protective film 28 will be removed from the active surface 32 of the microelectronic die 30 and the first, or active surface 24 of the microelectronic package core 20, following an encapsulation process.

Figure 5:
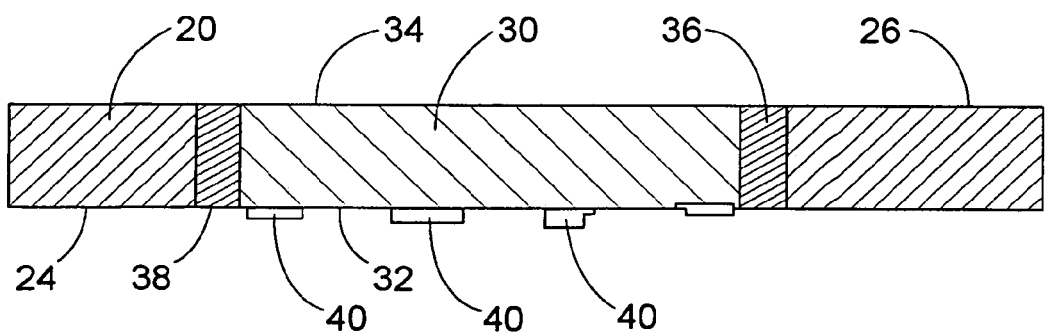
FIG. 5 is a side cross-sectional view of the assembly of FIG. 4 illustrating electrical contacts on the microelectronic die.

The microelectronic die 30 is then encapsulated using an encapsulation material 36 to fill the portions of the opening 22 in the microelectronic package core 20 which are not occupied by the microelectronic die 30, as shown in FIG. 5. The encapsulation of the microelectronic die 30 may be achieved by any known process, including but not limited to transfer and compression molding, and dispensing. It is also possible to perform such an encapsulation process without use of a protective film. The encapsulation material 36 serves to secure the microelectronic die 30 within the microelectronic package core 20 and provides mechanical rigidity for the resulting structure together with surface area for the subsequent build-up of conductive trace layers.

After encapsulation, the protective film 28 is removed, as shown in FIG. 4, to expose the microelectronic die active surface 32 with the encapsulation material 36 serving as a filler for the space between the microelectronic package core 20 and the microelectronic die 30. The result is at least one surface 38 that is substantially coplanar with the microelectronic die active surface 32 and the microelectronic package core first, or active surface 24. FIG. 5 illustrates a microelectronic die 30 encapsulated with encapsulation material 36 within the microelectronic package core 20. The microelectronic die 30 includes a plurality of electrical contacts 40 located on the microelectronic die active surface 32. The electrical contacts 40 are electrically connected to circuitry (not shown) within the microelectronic die 30 but, for sake of simplicity and clarity, it will be appreciated that only four electrical contacts 40 have been shown in FIG. 5.

Figure 6:
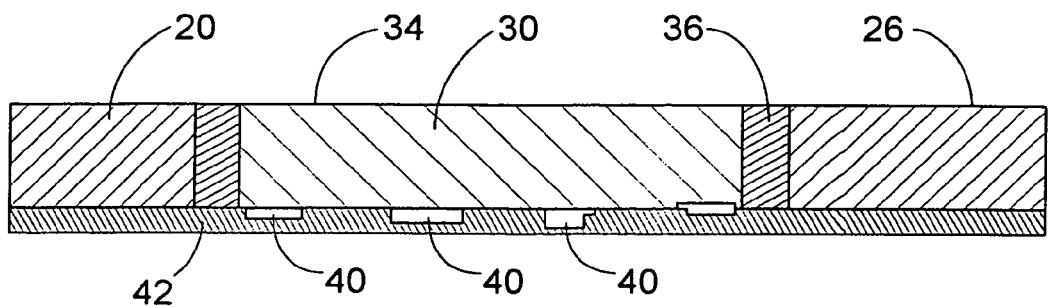
FIG. 6 is a side cross-sectional view of the assembly of FIG. 5 illustrating a dielectric layer covering the electrical contacts.

As shown in FIG. 6, a dielectric layer 42, such as epoxy resin, polyimide, bisbenzocyclobutene, and the like, is disposed over the microelectronic die active surface 32. The dielectric layer 42 covers the electrical contacts 40 as well as the microelectronic package core first, or active, surface 24 and the encapsulant material surface 38. The formation of the dielectric layer 42 may be achieved by any known process, including but not limited to lamination, spin coating, roll coating, and spray-on deposition.

Figure 7:
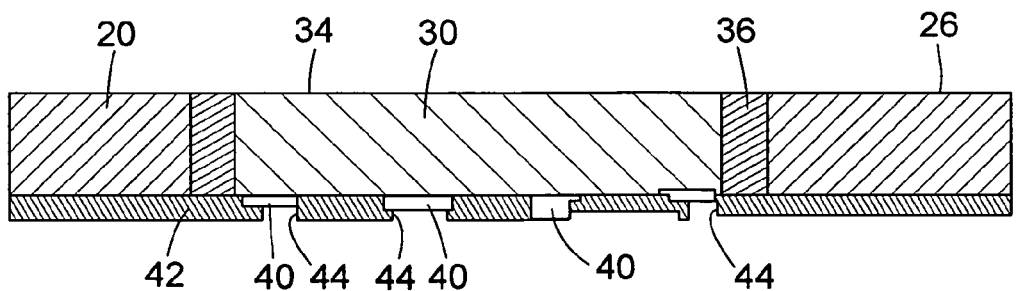
FIG. 7 is a side cross-sectional view of the assembly of FIG. 6 after the formation of a plurality of vias through the dielectric layer.

As shown in FIG. 7, a plurality of vias 44 is then formed through the dielectric layer 42 by any method known in the art, including but not limited to laser drilling, photolithography, etc. If the dielectric layer 42 is photoactive, the plurality of vias 44 may be formed in the same manner that a photoresist mask is made in a photolithographic process, as known in the art.

Figure 8:
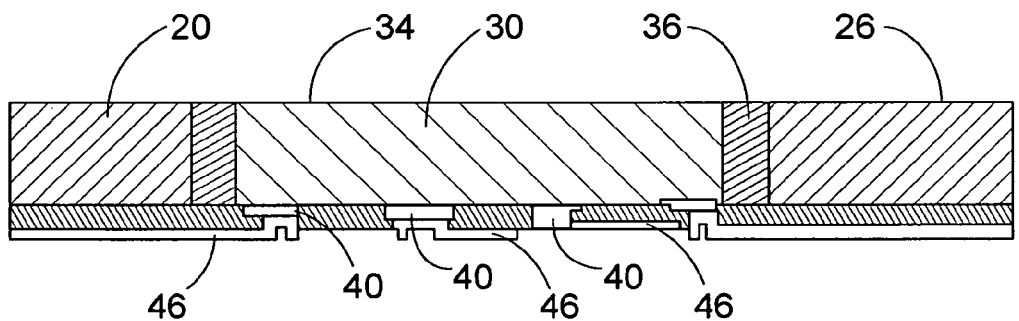
FIG. 8 is a side cross-sectional view of the assembly of FIG. 7 illustrating the formation of a plurality of conductive traces.

A plurality of conductive traces 46 is formed on the dielectric layer 42, as shown in FIG. 8. A portion of each of the plurality of conductive traces 46 is formed so as to extend into at least one of the plurality of vias 44 (see FIG. 7) in order to make electrical contact with the contacts 40 on the microelectronic die 30. The plurality of conductive traces 46 may be formed of any suitable conductive material, such as copper, aluminum, alloys thereof, and conductive polymer resins.

The plurality of conductive traces 46 may be formed by any known technique, including but not limited to semi-additive plating and photolithographic techniques. An exemplary semi-additive plating technique can involve depositing a seed layer, such as a sputter-deposited or electroless-deposited metal on the dielectric layer 42. A resist layer can then be deposited and then patterned on the seed layer. A layer of metal, such as copper, can then be applied by electrolytic plating on the seed layer exposed by open areas in the patterned resist layer. The patterned resist layer can then be stripped and portions of the seed layer not having the layer of metal plated thereon can be etched away to complete the formation of the conductive traces 46. While the foregoing sets forth one known technique for forming conductive traces, other methods of forming the plurality of conductive traces 46 will be apparent to those skilled in the art.

Figure 9:
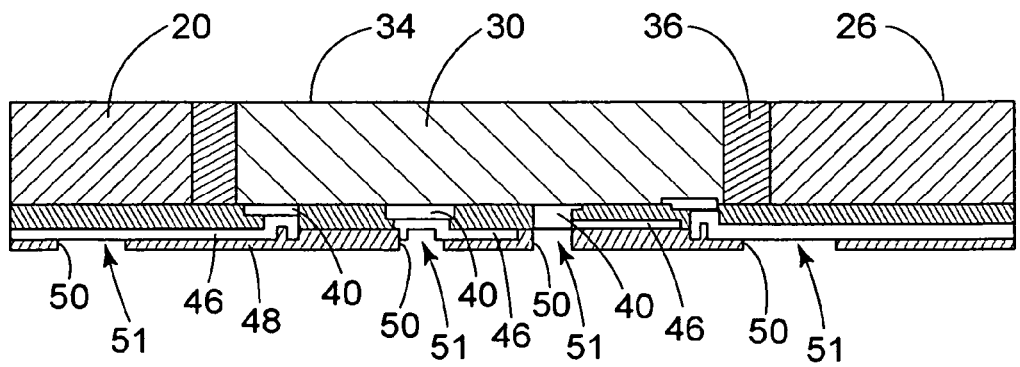
FIG. 9 is a side cross-sectional view of the assembly of FIG. 8 illustrating the formation of a solder mask and vias.
Figure 10:
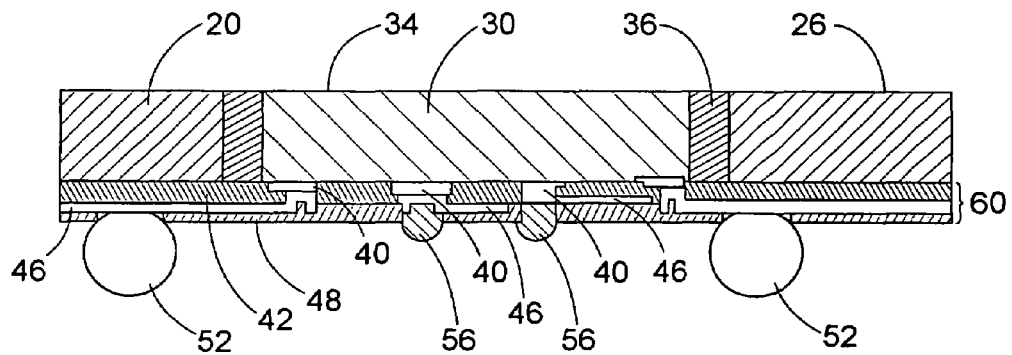
FIG. 10 is a side cross-sectional view of the assembly of FIG. 9 illustrating the formation of a plurality of solder balls.

The sequence of process steps used to deposit the dielectric material, form vias, and form traces can be repeated as needed to dispose the traces in such positions as may be required to achieve a suitable interconnection or to meet electrical or other performance requirements. Once the conductive traces 46 are formed, they can be used in the formation of conductive interconnects with solder bumps, solder balls, pins, and the like for communication with external components, such as an optical substrate. For example, a soldermask material 48 can be disposed over the dielectric layer 42 and the conductive traces 46 with soldermask openings 51, as shown in FIG. 9, and a plurality of vias 50 can then be formed in the solder mask material 48 to expose at least a portion of each of the conductive traces 46. A plurality of conductive bumps 52 such as a ball grid array (BGA) can be placed in contact with the exposed portion of the conductive traces 46 and secured thereto by a reflow process, as shown in FIG. 10.

Figure 11:
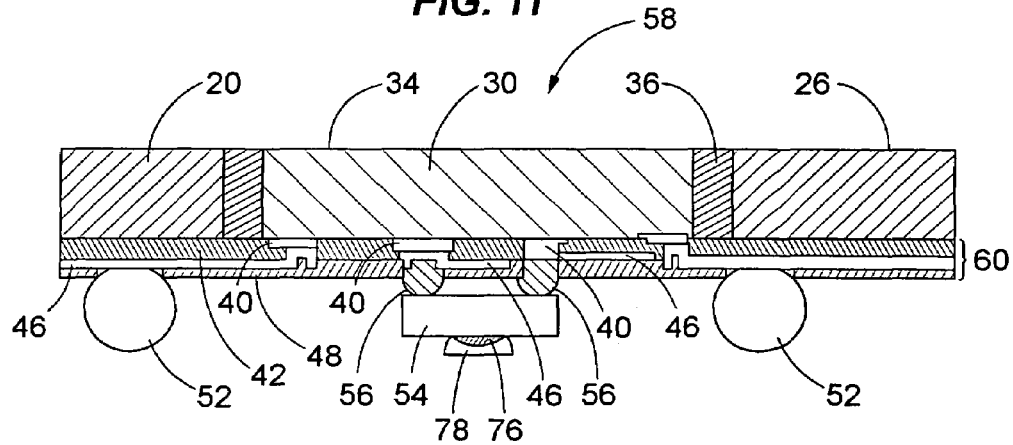
FIG. 11 is a side cross-sectional view of the assembly of FIG. 10 illustrating an electrooptic element electrically connected to a microelectronic die.

FIG. 11 illustrates an electrooptic element 54 such as a vertical cavity surface emitting laser (VCSEL) or photodetector in contact with at least one conductive trace 46 to convert an electrical signal from the microelectronic die 30 to an optical signal or vice versa. The electrooptic element 54, as shown in FIG. 11, is in contact with a pair of conductive traces 46 through solder balls 56 that by means of a reflow process secure the electrooptic element 54 to the microelectronic package 58. As will be appreciated, the microelectronic package 58 is defined by the microelectronic package core 20, the microelectronic die 30, the encapsulant material 36, and the build-up layer or layers 60 defined by the dielectric layer 42, the conductive traces 46, and the solder mask material 48.

Figure 12:
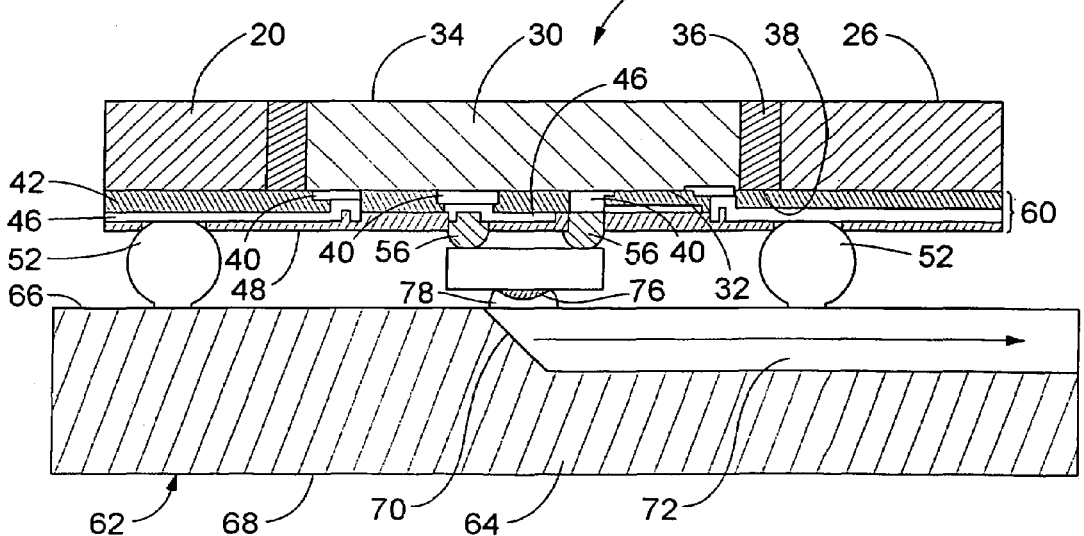
FIG. 12 is a side cross-sectional view of the assembly of FIG. 11 secured to an electrooptic printed circuit board having a coupler and waveguide.

As shown in FIG. 12, an electrooptic PCB 62 secured to the microelectronic package 58 with the BGA 52 has a first surface 66 and a second surface 68 opposite the first surface 66. FIG. 12 illustrates that a coupler 70 and waveguide 72 is provided in or on one of the first and second surfaces, such as the first surface 66, or at an intermediate position, and they are positioned relative to the active side of the microelectronic package 58 to be spaced from but facing the microelectronic die active surface 32. FIG. 12 also illustrates that the active side of the microelectronic package 58 is defined at least in part by the active surface 32 of the microelectronic die 30 and the corresponding active surfaces 24 and 38 of the microelectronic package core 20 and the encapsulation material 36, respectively, all of which are coplanar. FIG. 12 also further illustrates that the build-up layer or layers 60 on the active side of the microelectronic package 58 is provided on at least one, and preferably all, of the microelectronic die active surface 42 and corresponding active surfaces 24 and 38 of the microelectronic package core 20 and the encapsulation material 36, respectively. The positions of the BGA joints illustrated in FIG. 12 are determined by the positions of the soldermask openings 51. The soldermask openings for the BGA balls which secure the microelectronic package 58 to the electrooptic printed circuit board 64 and the BGA balls which secure the electrooptic element 54 would preferably be made as part of the same patterning process, or with a single exposure of the same mask, if the patterning process is photo-lithographically based.

Alignment between the electrooptic element and the coupler may be achieved by solder self-alignment. Such self-alignment may be achieved, for example, by BGA reflow. Successful alignment by this method requires accurate placement of the coupler with respect to the BGA solder mask openings of the optical substrate.

Still referring to FIG. 12, the electrooptic element 54 may include an integrated lens 76 to focus and transmit the optical signal to or from the coupler 70 and waveguide 72. A refractive-index matched material as at 78 may be provided on a surface of the integrated lens 76 generally adjacent the coupler 70 and waveguide 72. FIG. 12 also illustrates that the optical substrate 62 may comprise a printed circuit board having the coupler 70 and waveguide 72 therein, for example, on the side facing the microelectronic package 58.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An electrooptic assembly, comprising:
    a microelectronic package having an active side, wherein said microelectronic package includes a core having an opening in which a microelectronic die is adhered by an encapsulation material;
    a build-up layer on the active side of the microelectronic package and including a conductive trace;
    an optical substrate;
    an electrooptic element coupled to said build-up layer to convert and transmit a signal from one of said microelectronic package and said optical substrate to the other of said microelectronic package and said optical substrate; and
    a bonding agent bonding said optical substrate to said build-up layer.

2. The electrooptic assembly of claim 1, wherein said optical substrate has a coupler and a waveguide.

3. The electrooptic assembly of claim 2, wherein said electrooptic element converts a signal from one of said microelectronic die and said coupler and transmits said signal to the other of said microelectronic die and said coupler.

4. The electrooptic assembly of claim 2, wherein said electrooptic element converts an electrical signal from said microelectronic die to an optical signal and transmits said optical signal into said coupler.

5. The electrooptic assembly of claim 2, wherein said electrooptic element converts an optical signal from said coupler to an electrical signal and transmits said electrical signal to said microelectronic die.

6. The electrooptic assembly of claim 2, including a refractive-index matched material on a surface of said electrooptic assembly generally adjacent said coupler.

7. The electrooptic assembly of claim 2, wherein said electrooptic element includes an integrated lens to focus and transmit said optical signal to said coupler.

8. The electrooptic assembly of claim 1, wherein said active side is defined by an active surface of said microelectronic die and corresponding surfaces of said core.

9. The electrooptic assembly of claim 8, wherein said encapsulation material in said opening in said core of said microelectronic package is coplanar with said active surface of said microelectronic die.

10. The electrooptic assembly of claim 8, wherein the build-up layer on said active side of said microelectronic package supports the conductive trace in electrical contact with said microelectronic die.

11. The electrooptic assembly of claim 10, wherein said build-up layer comprises a dielectric layer through which said conductive trace extends for contact on said active side of said microelectronic package.

12. The electrooptic assembly of claim 10, including a solder ball to secure said electrooptic element to said conductive trace and to a patterned opening of a solder mask on said build-up layer.

13. The electrooptic assembly of claim 12, wherein said bonding agent includes a solder ball secured to said optical substrate and to a patterned opening on said build-up layer of said microelectronic package.

14. The electrooptic assembly of claim 13, wherein said patterned openings for said electrooptic element and said bonding agent are patterned by a single patterning process in a single layer for said solder mask.

15. The electrooptic assembly of claim 14, wherein said patterning process includes patterning said patterned opening for said electrooptic element and bonding agent with a single photolithographic mask.

16. The electrooptic assembly of claim 1, wherein said electrooptic element is between said microelectronic package and said optical substrate and comprises a VCSEL.

17. The electrooptic assembly of claim 1, wherein said electrooptic element is between said microelectronic package and said optical substrate and comprises a photodetector.

18. The electrooptic assembly of claim 1, wherein said optical substrate comprises a printed circuit board having a coupler and a waveguide therein.

19. A method of fabricating an electrooptic package, comprising:
    bonding an electrooptic element to a build-up layer on an active side of a microelectronic package having a microelectronic die, where at least a portion of the build-up layer is on an active surface of the microelectronic die;
    positioning an optical substrate having a coupler and a waveguide to face said electrooptic element; and
    bonding said build-up layer of said microelectronic package to said optical substrate such that said electrooptic element is in alignment with said coupler.

20. The method of claim 19 wherein said electrooptic element is bonded with a solder ball to a patterned opening of a solder mask on the build-up layer on said active side of said microelectronic package.

21. The method of claim 19 wherein said optical substrate is bonded with a solder ball to a patterned opening of a solder mask on the build-up layer on said active side of said microelectronic package.

22. The method of claim 19 wherein alignment between the electrooptic element and the coupler uses solder self-alignment.

* * * * *